United States Patent [19]

Motyka et al.

[11] Patent Number: 4,785,496
[45] Date of Patent: Nov. 22, 1988

[54] HINGEABLE PLATE ASSEMBLY AND DISPLACEABLE HINGE THEREFOR

[75] Inventors: Victor Motyka, Attleboro; James S. Kenworthy, Rockland, both of Mass.

[73] Assignee: Precision Art Coordinators, Inc., East Providence, R.I.

[21] Appl. No.: 116,400

[22] Filed: Nov. 3, 1987

[51] Int. Cl.⁴ .............................................. E05D 7/00
[52] U.S. Cl. ...................................... 16/223; 16/224; 16/361; 355/75
[58] Field of Search ...................... 16/223, 224, 361; 355/75, 76, 82

[56] References Cited

U.S. PATENT DOCUMENTS 2,777,156 11/1951 Weisgarber ........................ 16/361
3,352,222 11/1967 Salger ................................ 355/82
3,724,949 4/1973 Kanno et al. ..................... 355/75
4,390,267 6/1983 Minor ................................ 355/75

Primary Examiner—Nicholas P. Godici
Assistant Examiner—Richard K. Seidel
Attorney, Agent, or Firm—Salter & Michaelson

[57] ABSTRACT

A hingeable plate assembly includes first and second substantially flat glass plates and first and second displaceable hinges for hingeably connecting the plates so that the second plate is outwardly displaceable with respect to the first plate in substantially parallel aligned relation thereto. The hinges each include first and second hinge pieces which are attached to the first and second plates, respectively, and pivot elements which are captured between the respective first and second hinge pieces thereof. The pivot elements are preferably formed as spherical balls which are received in elongated slots in the respective first hinge pieces thereof and sockets in the respective second hinge pieces thereof. The ball elements can rotate in the respective slots and/or sockets thereof to enable the second plate to be hinged relative to the first plate, and they can travel in the respective slots thereof to enable the second plate to be displaced outwardly from the first plate.

14 Claims, 1 Drawing Sheet

U.S. Patent   Nov. 22, 1988   4,785,496
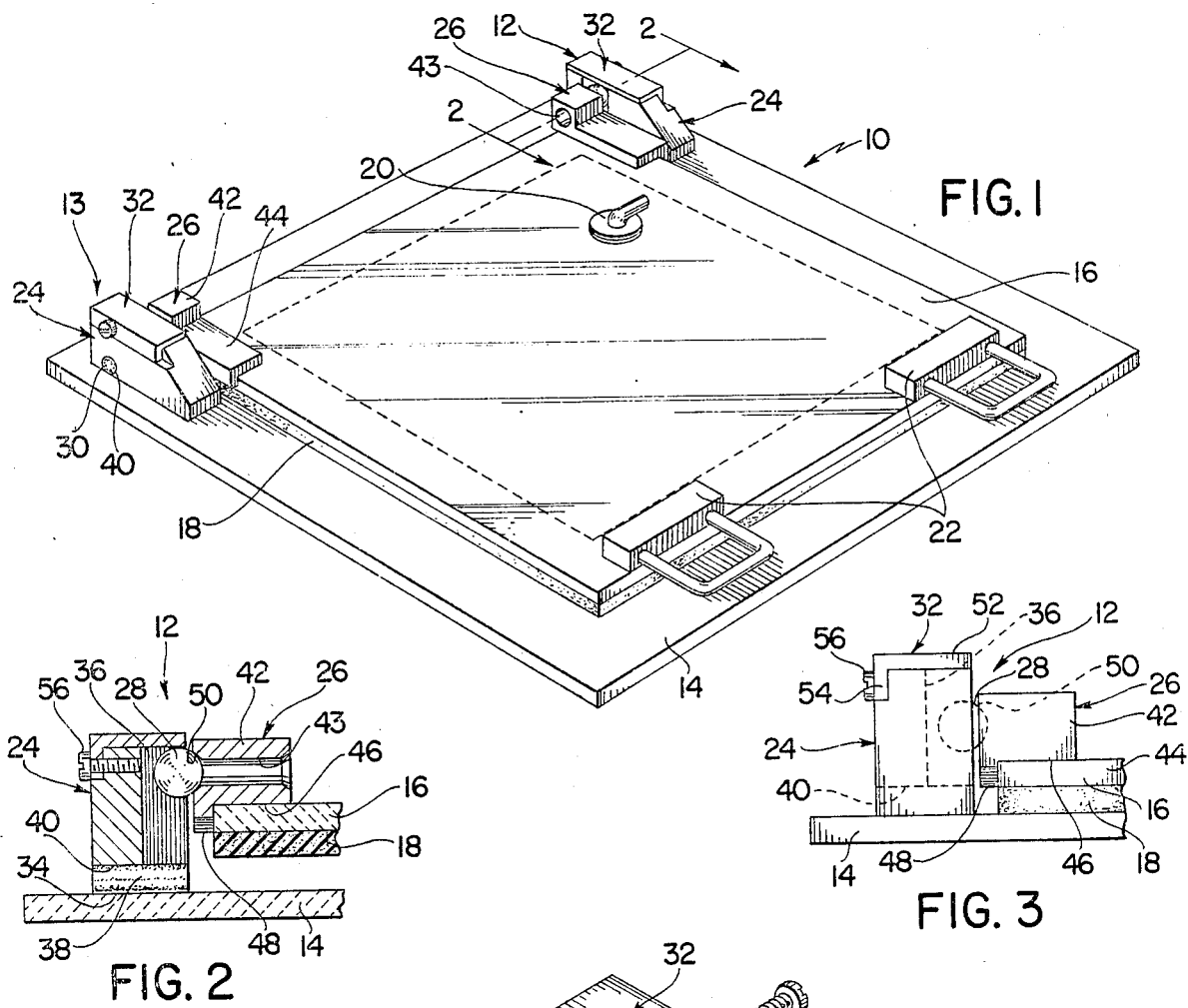
FIG. 1
FIG. 2
FIG. 3
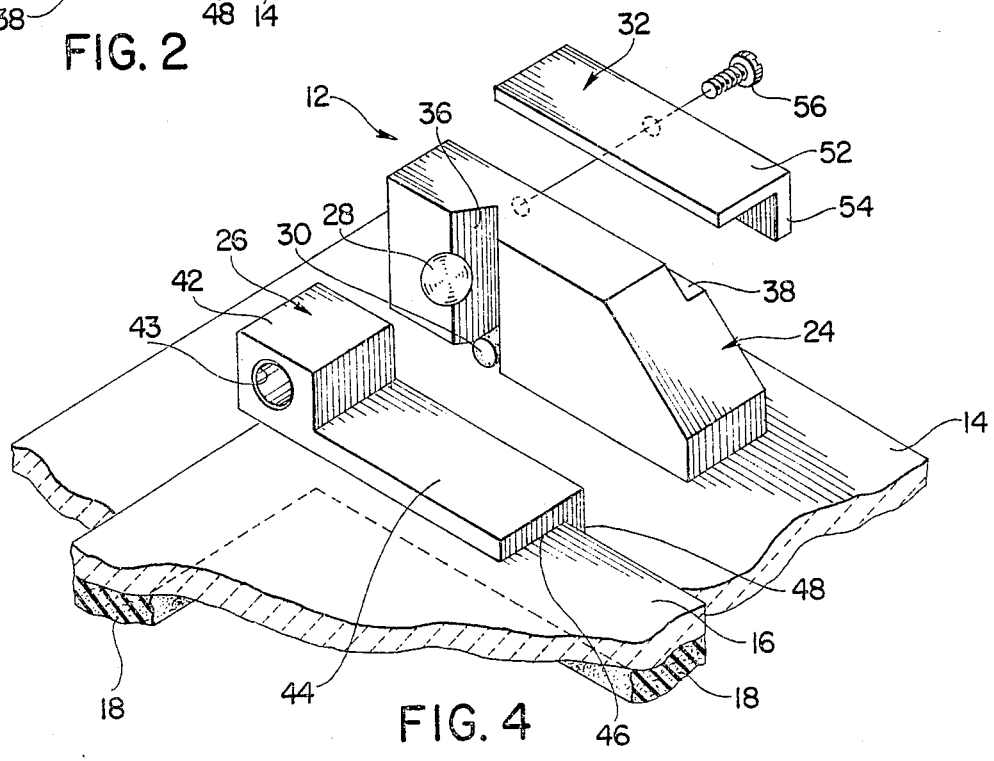
FIG. 4

HINGEABLE PLATE ASSEMBLY AND DISPLACEABLE HINGE THEREFOR

BACKGROUND AND SUMMARY OF THE INVENTION

The instant invention relates to hingeable plate assemblies of the general type utilized for carrying out photolithographic processes and more particularly to an improved hingeable plate assembly and to a displaceable hinge assembly therefor.

Photoglithograph processes have generally been found to be highly effective for use in forming relief patterns on various substrates, such as those utilized in manufacturing printed circuit boards. In this connection, typically a photolithographic process of this type is carried out by applying a mask image to a glass plate, and then overlaying the glass plate on a substrate which has been previously coated with a photosensitive polymer. The unmasked areas of the substrate are then exposed to actinic radiation in order to effect a desired reaction in the photosensitive polymer thereon. Thereafter, the glass plate is removed from the substrate, and the substrate is exposed to a solvent treatment process and/or an etching process in order to produce a desired relief image on the substrate which is either the same as or a mirror image of the mask image on the glass plate, depending on the particular process. Similar processes have been found to be highly effective for simultaneously applying images to both sides of substrates utilizing hingeable plate assemblies comprising pairs of masked glass plates which are hingeably connected together. A process of this type is generally carried out by positioning a substrate between a pair of glass plates having mask images thereon and then simultaneously applying actinic radiation to a photosensitive polymer which has been preapplied to both sides of the substrate. Thereafter both sides of the substrate are exposed to a solvent process and/or an etching process in order to form the desired relief image patterns on the substrate.

It has generally been found that it is extremely important to be sure that a mask image on a plate utilized in a photolithographic process of the above type is precisely aligned with respect to the appropriate surface of the substrate to which the image is to be applied before the surface is exposed to actinic radiation. It has also been found that it is extremely important to be sure that both of the mask images on the plates of a hingeable plate assembly utilized in a process of this type are properly oriented with respect to each other before the surfaces of a substrate which is interposed therebetween are exposed to actinic radiation. In this connection, it has been found that proper image orientation can be particularly critical when utilizing a photolithographic process for forming a substrate for a printed circuit board where an improperly oriented image can cause one or more open circuits, short circuits, or improper resistances.

Unfortunately, the plate assemblies which have been heretofore available for use in photolithographic processes of the above type have generally been found to be less than satisfactory for consistently applying images to the opposite sides of substrates in proper orientations. In this connection, it has been found that it is generally necessary for the hinge mechanisms of plate assemblies of this type to allow the respective plates thereof to be displaced outwardly at least slightly relative to each other in order to enable the plate assemblies to accommodate substrates of different thicknesses. As a result, many of the hinge mechanisms which have been utilized in the heretofore available plate assemblies of this general type have included resiliently flexible elements in order to adapt them so that the plates thereof can be resiliently displaced outwardly relative to each other to varying degrees. However, it has been found that plate assemblies which include resilient hinge mechanisms of this type are generally incapable of repeatably operating with high degrees of precision for aligning images on the plates thereof with respect to substrates. Specifically, it has been found that the resiliently flexible elements in the hinge mechanisms of plate assemblies of this type generally allow the plates thereof to be shifted to misaligned positions wherein the mask images thereon are out of alignment with respect each other.

Plate assemblies representing the closest prior art to the instant invention of which the applicant is aware are disclosed in the U.S. Pat. Nos. to Freiberg 4,412,739; Postupack 4,421,836; Tongel 4,445,775; Bowser 4,446,184; Kenworthy et al 4,584,216; and Emmert 4,600,298. However, while a number of these references have recognized the need for providing an effective plate assembly which is adapted to accommodate substrates of different thicknesses without allowing the plates thereof to be shifted to misaligned positions, they have generally failed to provide an effective solution to this problem. In any event, the devices disclosed in these references fail to suggest the novel structural features of either the plate assembly of the subject invention or the hinge assembly of the subject invention, and hence they are belived to be of only general interest with respect thereto.

The instant invention provides an effective hingeable plate assembly and a displaceable hinge assembly therefor which overcome the disadvantages of many of the heretofore available plate assemblies and hinge assemblies. The displaceable hinge assembly of the instant invention comprises a first hinge piece which is securable to a first member and has an elongated slot formed therein of preferably V-shaped configuration. The hinge assembly further comprises a second hinge piece which is securable to a second member and a pivot member mounted in a predetermined fixed position on the second member wherein it is receivable in the slot in the first hinge piece. The second hinge piece preferably has a socket formed therein, and the pivot member preferably comprises a spherical ball element which is received in the socket in the second hinge piece and in the slot in the first hinge piece, and the first and second hinge pieces are preferably assembled so that the ball element is captured between the first and second hinge pieces. When the hinge assembly is constructed in this manner, the ball element can travel in the slot to enable the second hinge piece to be displaced outwardly relative to the first hinge piece in a direction substantially parallel to the slot, and the ball element can rotate in the socket and/or the slot to enable the second hinge piece to be pivoted relative to the first hinge piece. The hinge assembly further comprises means for obstructing the ends of the slot in the first hinge piece and means for maintaining the first and second hinge pieces in closely adjacent relation in order to retain the ball element in captured relation in the slot and the socket.

The hingeable plate assembly of the instant invention comprises first and second plates and first and second displaceable hinge assemblies of the above described type which are assembled with the plates so that the first hinge pieces of the hinge assemblies are attached to the first plate and so that the second hinge pieces thereof are attached to the second plate. The plates are preferably of substantially flat, rectangular configuration, and the slots in the first hinge pieces preferably extend in substantially perpendicular relation to the first plate. When the hinge assemblies are assembled in this manner, the plates maintain the first and second hinge pieces in closely adjacent relation; and since the slots extend in substantially perpendicular relation to the first plate, the second plate is outwardly displaceable relative to the first plate in a direction which is substantially perpendicular to the first plate, although it is nevertheless hingeable relative to the first plate. The plate assembly of the instant invention preferably further comprises a compressible gasket on one of the plates which is interposed between the two plates when they are received in closely adjacent, substantially parallel relation, and the gasket is preferably adapted so that it defines a frame between the plates. Further, the plate assembly is preferably constructed so that the interior frame defined by the gasket can be evacuated to draw the first and second plates together, and the first and second plates are preferably constructed from a transparent glass.

It has been found that both the hinge assembly of the instant invention and the plate assembly which comprises the hinge assembly can be effectively utilized in connection with photolithographic processes, such as those utilized in the manufacture of printed circuit boards. In this connection, for use of the plate assembly of the instant invention in a photolithographic process, the plates are preferably embodied as glass plates, and photomasking materials are applied to the plates in order to define predetermined mask images thereon. Thereafter, a substrate having a photosensitive polymer on the surfaces thereof is assembled between the plates so that the mask images on the plates are overlaid on the appropriate surfaces of the substrate, and the entire assembly is then exposed to actinic radiation. In this connection, because the hinge assemblies of the instant invention enable the plates to be displaced outwardly with respect to each other while nevertheless maintaining the plates in aligned relation, the plate assembly can effectively accommodate substrates of various thicknesses.

Accordingly, it is a primary object of the instant invention to provide an effective displaceable hinge assembly which is operative with a positive hinging action for hingeably connecting a pair of first and second members together so that the second member is outwardly displaceable along a predetermined path with respect to the first member.

An even further object of the instant invention is to provide a hingeable plate assembly comprising hingeably connected first and second plates wherein the second plate is outwardly displaceable with respect to the first plate along a predetermined path.

An even further object of the instant invention is to provide an effective plate assembly for photolithographic processes which is operative with a high degree of accuracy and repeatability.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention:

FIG. 1 is a perspective view of the plate assembly of the instant invention;

FIG. 2 is a sectional view of the right hinge assembly thereof taken along line 2—2 in FIG. 1;

FIG. 3 is a rear view of the hinge assembly; and

FIG. 4 is an enlarged exploded perspective view of the right hinge assembly and the adjacent portions of the plates.

DESCRIPTION OF THE INVENTION

Referring now to the drawing, the plate assembly of the instant invention is illustrated in FIG. 1 and generally indicated at 10. The plate assembly 10 comprises first and second hinge assemblies of the instant invention which are generally indicated at 12 and 13, respectively, in FIGS. 1 through 4 and FIG. 1, respectively, and first and second substantially flat plates which are generally indicated at 14 and 16, respectively in FIG. 1. The hinge assemblies 12 and 13 are preferably attached to the plates 14 and 16 with a suitable adhesive for hingeably connecting the plates 14 and 16 together so that the second plate 16 is outwardly displaceable relative to the first plate 14 in substantially parallel relation to the first plate 14. The plate assembly 10 further comprises a gasket element 18 on the second plate 16, an evacuation port 20 on the second plate 16, and a pair of handle elements 22 on the second plate 16, as will hereinafter be more fully set forth.

The plates 14 and 16 preferably comprise first and second substantially flat, clear glass plates of preferably substantially rectangular configuration. As illustrated in FIG. 1, the second plate 16 is preferably formed in a somewhat smaller overall dimension than the first plate 14.

The gasket element 18 is preferably made from a suitable compressible rubberized material, and it is secured to the underside of the second plate 16 with a suitable adhesive. The gasket 18 is formed and oriented so that it defines a frame which extends around the peripheral portions of the underside of the second plate 16 to define the perimeter of an enclosed area between the first and second plates 14 and 16 when the plates 14 and 16 are positioned in closely adjacent, substantially parallel relation.

The evacuation port 20 is assembled in sealed relation in an aperture in the second plate 16 so that it communicates with the enclosed area defined by the gasket 18 when the plates 14 and 16 are positioned in closely adjacent, substantially parallel relation. The port 20 is preferably made from a suitable metal, such as brass, and it is adapted to be connected to a source of vacuum for evacuating the enclosed area between the plates 14 and 16 in order to draw the plates 14 and 16 together.

The handle elements 22 are preferably of conventional construction, and they are preferably secured to the upper surface of the second plate 16 with a suitable adhesive to enable them to be utilized for hingeably moving the second plate 16 relative to the first plate 14.

The first and second hinge assemblies 12 and 13, respectively, are preferably formed in mirror images of each other, and they preferably each comprise a first hinge piece generally indicated at 24 which is attached to the first plate 14, a second hinge piece generally indicated at 26 which is attached to the second plate 16, a pivot element 28 which is captured between the first and second hinge pieces 24 and 26, respectively, thereof, a stop element 30, and a retainer plate 32.

Each of the hinge pieces 24 is preferably formed from a suitable metal, such as stainless steel, and each preferably has a substantially flat bottom surface 34 thereon which is adapted to be secured to the first plate 14 with a suitable adhesive. Each of the first hinge pieces 24 is further formed with an elongated slot 36 of preferably V-shaped configuration on one side thereof which is dimensioned for receiving the respective ball element 28 thereof and which is formed so that it extends in substantially perpendicular relation to the bottom surface 34 thereof. Each of the first hinge pieces 24 is further formed with a notch 38 therein which extends along the upper edge of the opposite side thereof from the slot 36. Each of the hinge pieces 24 is further formed with an aperture 40 therein which extends inwardly to the slot 36 thereof in closely adjacent relation to the bottom surface 34 thereof, and the hinge pieces 24 are preferably assembled on the first plate 14 so that the V-shaped slots 36 of the first hinge pieces 24 face inwardly toward each other in opposing relation.

Each of the second hinge pieces 26 is preferably also made from a suitable metal, such as stainless steel, and each preferably comprises an upper block portion 42 having an aperture 43 therethrough, a mounting portion 44 having a substantially flat bottom mounting surface 46 thereon, and a flange 48 which extends downwardly from the mounting portion 44 thereof so that it cooperates with the bottom surface 46 thereof to define a substantially right angle. Each of the second hinge pieces 26 is further formed with a beveled edge 50 which thereon defines the outer end of the aperture 43 therein to provide a socket for receiving the respective ball element 28 thereof, as will hereinafter be more fully set forth. Each of the second hinge pieces 26 is assembled in the plate assembly 10 in closely spaced relation to the respective first hinge piece 24 thereof with the bottom surface 46 of each of the second hinge pieces 26 adhesively secured to the upper surface of the second plate 16 and with the flange portion 48 of each of the second hinge pieces 26 abutting the adjacent side edge of the plate 16. Each of the second hinge pieces 26 is further assembled and oriented so that the socket defined by the aperture 43 and the beveled edge 50 thereof faces the slot 36 in the respective adjacent first hinge piece 24.

The pivot elements 28 preferably comprise spherical balls made of a suitable metal, such as stainless steel. Each of the ball elements 28 is received in captured relation in the slot 36 in the respective first hinge piece 24 thereof and in the respective socket defined by the aperture 43 and the beveled edge in the respective second hinge piece 26 thereof. In this connection, the first and second hinge pieces 24 and 26 are assembled in the hinge assembly 10 so that the plates 14 and 16 cooperate to maintain the first and second hinge pieces 24 and 26, respectively, of the hinge assemblies 12 and 13 in closely adjacent relation so that the ball elements 28 thereof are firmly captured between the first and second hinge pieces 24 and 26, respectively, thereof but so that the ball elements 28 can nevertheless travel in the respective slots 36 thereof and rotate in the slots 36 and/or the sockets thereof. Accordingly, the hinge pieces 26 can be both pivoted with respect to the hinge first pieces 24 and displaced with respect thereto in the longitudinal directions of the slots 36.

The stop elements 30 are preferably of elongated cylindrical configuration, and they are preferably formed from a suitable rubberized material. The stop elements 30 are assembled in the apertures 40 so that they extend into the lower portions of the slots 36 adjacent the first plate 14. Accordingly, the stop elements 30 are positioned so that they cooperate with the first plate 14 for limiting the extents of the downward travel of the ball elements 28 in the slots 36.

The retainer plates 32 are of angular configuration, and they include top plate portions 52 and side portions 54. The retainer plates 32 are secured on the first hinge pieces 24 so that the side portions 54 are received in the notches 38 with the top plate portions 52 extending over the upper ends of the slots 36 to limit the extents of the upward movement of the ball elements 28 in the slots 36.

Accordingly, for use and operation of the plate assembly 10, a suitable masking material is applied to the plates 14 and 16 to form predetermined mask images thereon, and a substrate is positioned in a predetermined aligned position between the plates 14 and 16. A vacuum is then applied to the vacuum port 20 to apply a vacuum to the interior area defined by the gasket 18 and the plates 14 and 16 so that the plates 14 and 16 are drawn together and received in mating relation with the opposite sides of the substrate. In this regard, as the plates 14 and 16 are drawn together in this manner, the ball elements 28 travel in the respective slots 36 thereof so that the second plate 16 is maintained in aligned orientation with respect to the first plate 14 as the two plates 14 and 16 are drawn together. As a result, the plate assembly 10 can effectively accommodate substrates of different thicknesses, and it can be effectively utilized for reliably and repeatably orienting the first and second plates 14 and 16 and the mask images thereon with respect to substrates.

It is seen, therefore, that the instant invention provides an effective plate assembly and an effective displaceable hinge assembly therefor. The hinge assemblies 12 are constructed to enable the plate 16 to be hinged upwardly with respect to the plate 14 while nevertheless enabling the second plate 16 to be displaced upwardly in substantially parallel relation with respect to the first plate 14. In this connection, because the ball elements 28 can only travel in predetermined paths as defined by the slots 36, the plate 16 is always maintained in precisely the same aligned relation with respect to the plate 14 whenever it is hinged to a position wherein it is substantially parallel with the plate 14. Accordingly, the plate assembly 10 is operative with a high degree of repeatability and accuracy, and it therefore represents a signficant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A displaceable hinge assembly comprising a first hinge piece securable to a first member, a second hinge piece securable to a second member, said first hinge piece having an elongated slot therein which faces said second hinge piece, said second hinge piece having a socket therein which faces said first hinge piece, a ball element received in said slot and said socket so that it is captured between said first and second hinge pieces, said ball element being longitudinally repositionable in said slot to enable said second hinge piece to be displaced outwardly relative to said first hinge piece in a direction substantially parallel to said slot and being rotatable relative to at least one of said first and second hinge pieces to enable said second hinge piece to be pivoted relative to said first hinge piece, and means maintaining said first and second hinge pieces in closely adjacent relation to thereby maintain said ball in said slot and said socket.

2. In the hinge assembly of claim 1, said slot being of V-shaped configuration.

3. In the hinge assembly of claim 1, said first and second members being substantially flat, said slot extending in a direction substantially perpendicular to said first member when said first hinge piece is secured to said first member to enable said second member to be displaced outwardly from said first member in a direction substantially perpendicular thereto when said second hinge piece is secured to said second member.

4. A hingeable plate assembly comprising first and second plates and first and second displaceable hinge assemblies hingeably connecting said first and second plates, each of said hinge assemblies comprising a first hinge piece attached to said first plate, a second hinge piece attached to said second plate, each of said first hinge pieces having an elongated slot therein which faces the respective second hinge piece thereof, the slots in the first hinge pieces of said first and second hinge assemblies being substantially parallel and facing in substantially opposite directions, each of said second hinge pieces having a socket therein which faces the respective first hinge piece thereof, a ball element received in the slot and the socket of each of said hinge assemblies so that it is captured between the respective first and second hinge pieces thereof, each of said ball elements being longitudinally repositionable in the respective slot thereof to enable the first plate to be displaced relative to the second plate and being rotatable relative to at least one of the respective first and second hinge pieces thereof to enable the first plate to be pivoted relative to the second plate, said first and second plates maintaining the respective first and second hinge pieces of said first and second hinge assemblies in closely adjacent relation to thereby maintain the respective ball elements thereof in the respective slots and sockets thereof.

5. In the hingeable plate assembly of claim 4 said slots extending in substantially perpendicular relation to said first plate.

6. In the hingeable plate assembly of claim 5 said plates being substantially flat.

7. In the hingeable plate assembly of claim 4, said slots being of V-shaped configuration.

8. In the hingeable plate assembly of claim 5, said first and second hinge pieces being constructed and being attached to said plates so that said second plate is receivable in closely spaced substantially parallel relation to said first plate.

9. The hingeable plate assembly of claim 8 further comprising compressible gasket means on one of said first or second plates and interposed between said first and second plates when said second plate is received in substantially parallel relation on said first plate.

10. In the hingeable plate assembly of claim 8, said gasket means defining a frame, the interior of said frame being evacuatable to draw said first and second plates together.

11. In the hingeable plate assembly of claim 5, at least one of said plates being transparent.

12. In the hingeable plate assembly of claim 5, at least one of said plates being glass.

13. A displacement hinge assembly comprising a first hinge piece securable to a first member and a second hinge piece securable to a second member, said first hinge piece having an elongated slot therein which faces said second hinge piece, a pivot element secured in a predetermined fixed location on said second hinge piece and received in said slot, said pivot element being longitudinally repositionable in said slot, and being rotatable relative to at least one of said first and second hinge pieces and means maintaining said first and second hinge pieces in closely adjacent relation to thereby maintain said pivot element in said slot.

14. A hingeable plate assembly comprising first and second plates and first and second displaceable hinge assemblies hingeably connecting said first and second plates, each of said hinge assemblies comprising a first hinge piece attached to said first plate and a second hinge piece atached to said second plate, each of said first hinge pieces having an elongated slot therein which faces the respective second hinge piece thereof, the slots in the first hinge pieces of said first and second hinge assemblies being substantially parallel and facing in substantially opposite directions, each of said hinge assemblies further comprising a pivot element received in the slot of the respective first hinge piece thereof, each of said pivot elements being longitudinally repositionable in the slot of the respective first hinge piece thereof and being rotatable relative to at least one of the respective first and second hinge pieces thereof, said first and second plates maintaining the respective first and second hinge pieces of said first and second hinge assemblies in closely adjacent relation to thereby maintain said pivot elements in the respective slots thereof.

* * * * *